United States Patent [19]
Dolby

[11] 3,967,219
[45] June 29, 1976

[54] SIGNAL COMPRESSORS AND EXPANDERS

[75] Inventor: Ray Milton Dolby, San Francisco, Calif.

[73] Assignee: Dolby Laboratories, Inc., San Francisco, Calif.

[22] Filed: Sept. 25, 1974

[21] Appl. No.: 509,076

Related U.S. Application Data

[63] Continuation of Ser. No. 432,171, Jan. 10, 1974, abandoned, which is a continuation of Ser. No. 232,113, March 6, 1972, abandoned.

[30] Foreign Application Priority Data

Mar. 12, 1971 United Kingdom............... 6747/71

[52] U.S. Cl. ............................... 333/14; 307/237; 333/17 L; 333/70 CR
[51] Int. Cl.² ...................... H04B 1/64; H03H 7/10; H03H 7/16; H03G 11/04
[58] Field of Search ................... 333/14, 17 R, 17 L, 333/70 R, 18, 28 R, 28 T; 328/168–173; 325/65–66, 473; 307/237

[56] References Cited
UNITED STATES PATENTS

| | | | |
|---|---|---|---|
| 2,052,110 | 8/1936 | Pfister | 333/14 X |
| 2,182,089 | 12/1939 | Lueder | 333/70 R X |
| 2,255,690 | 9/1941 | Wheeler | 333/17 X |
| 2,413,263 | 12/1946 | Suter | 333/70 R X |
| 2,936,426 | 5/1960 | McClean | 333/17 X |
| 3,281,723 | 10/1966 | Mercer | 333/18 |
| 3,314,026 | 4/1967 | Maynard | 333/70 R X |

OTHER PUBLICATIONS

"Reference Data for Radio Engineers," Howard W. Sams and Co., New York, 1968, pp. 7–4 and 7–5.

Primary Examiner—Alfred E. Smith
Assistant Examiner—Marvin Nussbaum
Attorney, Agent, or Firm—Robert F. O'Connell

[57] ABSTRACT

A compressor or expander circuit is constructed by connecting a plurality of impedance networks in series across input terminals, at least one network being frequency selective. Output terminals are connected across one or more of the networks. The frequency selective network varies its parameters in response to the level of components within a restricted frequency band determined by this network so as to narrow the band when the level of such components increases. This includes such components from the restricted band and thereby from the compression or expansion action.

26 Claims, 11 Drawing Figures

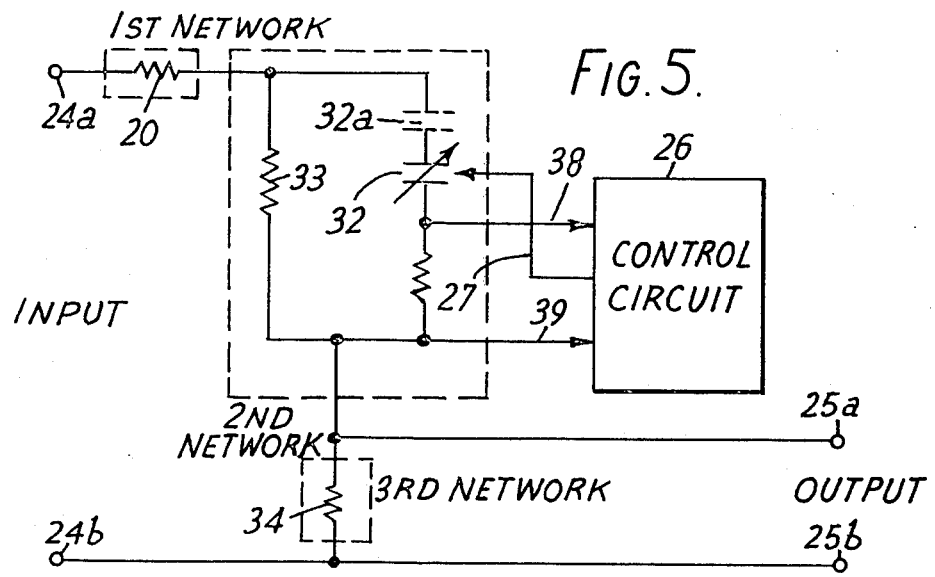
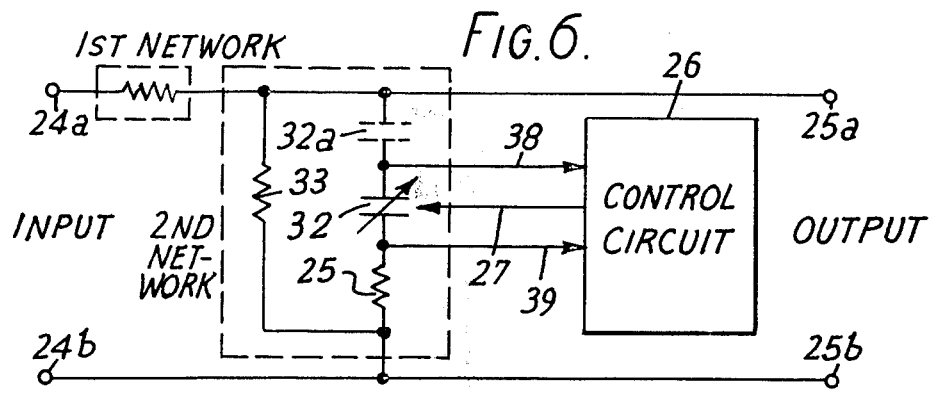
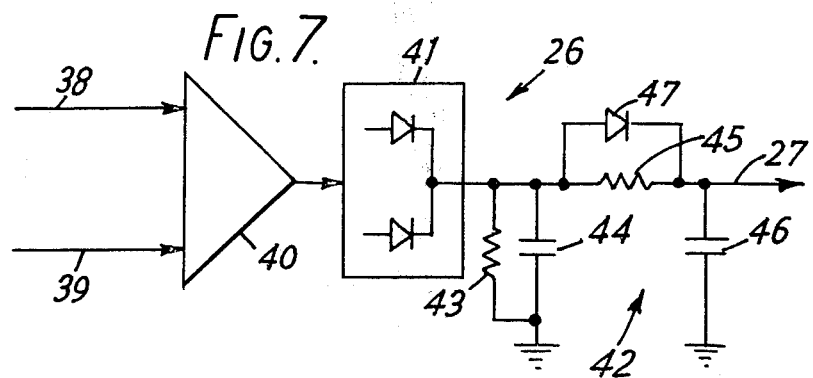

SIGNAL COMPRESSORS AND EXPANDERS

This is a continuation of application Ser. No. 432,171 filed on Jan. 10, 1974, now abandoned, which is a continuation of application Ser. No. 232,113 filed on Mar. 6, 1972, and now abandoned.

This invention relates to circuits which modify the dynamic range of an input signal — that is to say, signal compressors which compress the dynamic range and signal expanders which expand the dynamic range. Compressors and expanders are sometimes required to work independently of each other; more often, however, the compressor compresses the dynamic range of an input signal before the signal is transmitted or recorded. The complementary expander expands the dynamic range of the received signal or the signal played back from the recording — i.e. the expander restores the linearity of the dynamic range relative to the input signal. Noise introduced during transmission or the record/replay process is substantially reduced and the compressor-expander combination therefore acts as a noise reduction system.

A problem which exists with many dynamic range modification circuits for use in noise reduction systems is that they tend to distort or introduce level errors into high level signals; in a noise reduction system there is no need to modify high level signals, since noise usually has a low value relative to the maximum signal level. Thus such compressors and expanders should be designed in such a way that manipulations of signal dynamics are eliminated at high levels and are confined only to low levels. This can be achieved by the use of a general class of circuits, for producing an output signal in a specified frequency band in response to an input signal in this band and having, at any given frequency in the band, an input-output transfer characteristic which is divided into two regions comprising low and high levels, in which at least the high level region has transfer characteristics determined only by fixed circuit elements providing substantially linear transfer characteristics which on a decibel plot are parallel to but displaced from those of the low level region, the transition from the low level region to the high level region being effected by variable circuit means, the parameters of which are variable in response to the levels of one or more signals in the circuit, the said parameters passing to an extreme condition in effecting the transition from the low level region to the high level region, whereby in the high level region any variations and imperfections in the parameters have an insignificant influence on the transfer characteristic and the output signal.

Both the low and high level regions preferably have transfer characteristics determined only by fixed circuit elements, the said parameters passing from one extreme condition to an opposite extreme condition in effecting the transition from the low level region to the high level region, whereby only in an intermediate level region do the parameters have a significant influence on the transfer characteristics and the output signal, and whereby at the said two extreme parameter conditions any variations and imperfections in the parameters have an insignificant influence on the transfer characteristics and the output signal.

It will be convenient to refer to the high level transfer characteristic as the normal characteristic and regard the low level characteristic as a boosted characteristic in the case of a compressor and as a depressed or attenuated characteristic in the case of an expander. The alternatives of a boosted characteristic or a depressed characteristic will be referred to generally as a modified characteristic.

If compressors and complementary expanders are to be used in noise reduction systems it is important that signal modulated noise effects should be avoided. This is best achieved by ensuring that the various portions of the frequency spectrum are compressed or expanded as independently of each other as possible. Thus the degree of compression or expansion (i.e. the noise reduction) obtained at the extreme high audio frequencies, for example, should be influenced as little as possible by the signal levels at low and mid frequencies.

Compressors or expanders which operate in accordance with these principles employ frequency selective circuits which restrict the modified characteristic to restricted portions of the frequency band forming part of the specified frequency band, which can be referred to as the overall band. When a high level component appears at any frequency within the restricted band, the circuit adapts itself and causes the restricted band to narrow to exclude the said frequency, at which frequency the normal characteristic thereby obtains. The modified characteristic still applies within the narrow restricted band, whereby compressor or expander action, and hence noise reduction, is still effected within this narrowed band. This may be referred to as the narrowing band principle since the restricted band undergoes a narrowing action to confine compression, expansion and noise reduction to frequencies where only low level signal components are present. By this method a high degree of compression and expansion can be maintained at frequencies removed from the high level-signal frequency, with consequent good noise reduction and avoidance of signal modulated noise effects.

Examples of narrowing band circuits are described in British Patent Specifications Nos. 1120541 and 1253031 in the name of Ray Milton Dolby. In these examples, the transfer characteristic is obtained by means of two circuit paths whose outputs are combined and which respectively provide the normal characteristic at high levels and the modified characteristic at low levels.

It is an object of the present invention to provide a circuit in which only a single path is required and in which a series combination of impedance networks is employed to create the required transfer characteristics. At least one of the impedance networks includes variable circuit means. Dynamic range modifying circuits are already known which employ such series combinations of impedance networks, one of which includes a variable (controllable) resistor as a component thereof. These circuits are, however, either not frequency selective at all (as in the case of a circuit described in U.S. Pat. No. 3,281,706) or, if they are frequency selective, they do not operate on the narrowing band principle.

Examples of frequency selective circuits are to be found in British Patent Specification 1152435 and U.S. Pat. Nos. 3,449518 and 3,497,621. In these circuits a variable resistance is reduced in value to shunt out the frequency determining components of one of the series connected impedance networks and thereby reduce the amount by which the signal level is boosted or reduced in the restricted frequency band determined by the frequency determining components. In this action the restricted band is either substantially unaffected or is broadened, rather than narrowed, in the shunting process.

It is a specific object of this invention to provide a circuit in which, not only is only a single path required, but a narrowing band action is achieved.

According to the present invention, there is provided a circuit for modifying the dynamic range of an input signal, comprising a plurality of impedance networks connected in series with input terminals, and output terminals connected across one or more of the networks, at least one of the networks being a frequency selective network determining a restricted frequency band within which the modification of dynamic range takes place and including variable circuit means responsive to the level of signal components in the restricted band to reduce the degree of dynamic range modification as the level of such components increases, characterised in that the variable circuit means is effective to narrow the restricted band as the level of signal components within the restricted band increases, thereby to exclude such components from dynamic range modification.

A narrowing of the band can readily be achieved without a flattening of the characteristic (as in FIG. 2) by utilizing a variable reactive circuit element in the variable impedance network, although it is also possible to obtain the desired action with suitably connected variable resistances. The possible configurations of the impedance networks are varied, it being possible to create a boosted output signal in the restricted band for a compressor or a reduction in output signal within the restricted band at low levels. The variable network may consist only of the variable element or it may include fixed elements in various series and parallel configurations. Whether it is necessary to increase or decrease the value of the variable impedance with increase in signal level within the band will depend upon how the variable impedance creates the boosting or level reducing action and the direction in which it is necessary to move the limit or limits of the frequency band in order to narrow the restricted band.

A reduction in the impedance of the variable element will usually result in a decrease in impedance of the variable network. However, the opposite is also possible, such as in the case of a parallel resonant circuit in which a variable resistance in the tank alters the Q and therefore the impedance of the circuit in the opposite direction from the change in resistance.

The networks can be driven from a current source and the output voltage can be taken from across the series combination of networks. A complementary compressor-expander action which can be switchable if necessary can be obtained by driving the same series combination from a constant voltage source; the output is then derived from the current flowing through the series combination. If one of the networks is a pure resistance, then the output voltage can simply be the voltage developed thereacross.

If the variable impedances are variable reactances, it will usually be most convenient to use variable resistors in a circuit to derive the variable reactance. By the use of variable gain and the Miller effect, for example, it is possible to produce a variable capacitance.

If the signal to be handled is a carrier frequency, then the compressor is suitably adapted to deal with the carrier and its sidebands. This will usually involve a symmetrical narrowing and widening of the frequency band, although it is possible for the bandwidth control to be asymmetrical to suit single sideband or vestigial sideband carrier signals.

As mentioned previously, it is possible to produce tuned circuits with variable bandwidths by the use of variable resistances. It is also possible to vary the bandwidth by the use of a variable L/C ratio; both elements are controlled in such a way as to keep the resonant frequency constant, but the variable L/C ratio alters the impedance of the circuit off resonance and therefore produces the necessary band narrowing action.

In noise reduction systems it is usually sufficient to treat only the low level portion of the dynamic range — e.g. levels less than −20 dB, −40 dB, or even −60 dB with respect to the nominal maximum operating level (one, two or three orders of magnitude less). Any distortions introduced by the operation of the variable impedance are therefore confined to comparatively low levels, at which they are unobtrusive. At very low and very high levels distortion is avoided because the circuit characteristics are determined only by fixed circuit elements, which results in operation with dynamic range linearity in these level regions.

Both compressors and expanders of the invention are separately described herein, but it is also possible to effect a change of mode by the use of negative feedback amplifiers, a compressor or expander being put into the feedback loop to produce expander or compressor action respectively.

For applications such as video (television), in which non-linear distortion introduced by the compressor can effectively be compensated by the expander, it is possible to use non-linear impedances, such as diodes or non-linear reactances (e.g. saturable reactors) to effect the variable bandwidth action.

Where non-linear distortion is not permissible, such as in audio, the variable impedances can be controlled in response to a rectified and smoothed signal, whereby a linear or syllabic action is achieved. The control signal can be derived from a number of places in the circuit such as the input or output, but it is particularly advantageous to derive the signal from the current through or the voltage across a variable element of the variable impedance — i.e. from parts of the circuit in which the current or voltage is restricted, by the action of the circuit, to a small value at high input signal levels. This approach may require the use of a differential amplifier, but it has the advantage that the control voltage does not build up to excessively large values a high signal levels.

By the use of a two stage integration network it is possible to keep the attack time of the system short while at the same time keeping signal distortion and the generation of modulation products to a minimum. The first stage should have a short time constant. The second stage, having a longer time constant, is coupled to the first stage in a non-linear fashion, such as by a diode-resistor combination, whereby under relatively uniform signal conditions the second stage is able to provide additional smoothing. However, for large, abrupt changes in signal amplitude the non-linear network conducts and causes the time constant of the second network to be reduced.

During the attack period overshoots or undershoots may be produced. It is possible to limit these to a low amplitude by the use of appropriately connected non-linear elements such as diodes. Generally, the diodes should be coupled or connected to the variable impedance to prevent the voltage thereacross from exceeding a small value even under extreme transient conditions. Constant current diodes can be similarly used if the variable impedance current, not voltage, is limited to a small value at high input signal levels.

The invention will be described in more detail, by way of example, with reference to the accompanying drawings, in which:

FIGS. 1(a), (b) and (c) show curves illustrating narrowing band action;

FIGS. 2(a), (b) and (c) show comparable curves illustrating the operation of prior art circuits;

FIG. 5 illustrates another compressor embodying the invention;

FIG. 6 illustrates another expander embodying the invention; and

FIG. 7 shows a control circuit for use in FIGS. 4 to 6.

For simplicity, all subsequent description concerns only the case in which the restricted band forms the upper part of the overall band and in which variable reactances are used to produce the band narrowing effect, although variable resistances, low frequency bands, narrow bands, and carrier frequency and sideband bands could be similarly described. The invention is also applicable to a restricted band at the lower end of the overall band and circuits may be built to handle two or more restricted bands, such as one at the upper end and one at the lower end of the overall band. Similarly, there may be many bands to handle all the frequencies of concern, with minimal interaction; one or more of the bands need not have narrowing-band characteristics.

The illustrated circuits may be employed in audio equipment to reduce high frequency noise — e.g., high frequency tape noise — although, with appropriate choice of the frequency determining components, the circuits are applicable to any information signals. As mentioned, the restricted band may also be designed to deal with carrier signals and their sidebands — for example, in multiplex audio, instrumentation, and colour television applications.

Figure 1A:
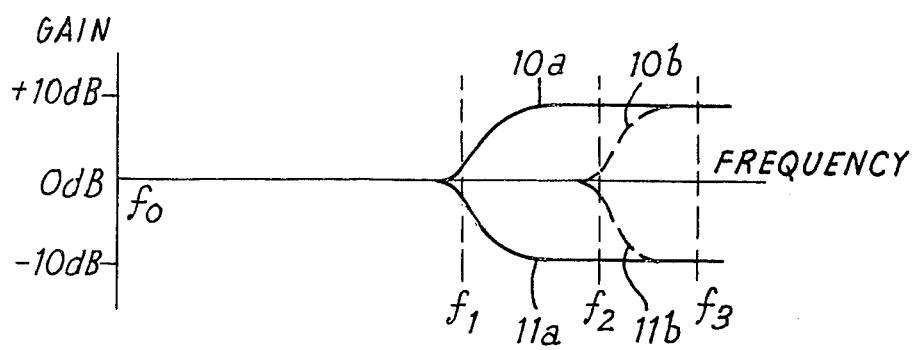

FIG. 1(a) shows a compressor characteristic 10a in full lines and an expander characteristic 11a in full lines extending over an overall frequency band between frequencies $f_0$ and $f_3$. Gain is plotted against frequency and, below a frequency $f_1$ the gain has a normal value which may be unity. Between $f_1$ and $f_3$ a restricted band exists in which the gain is modified, being boosted by 10dB, for example, in the case of a compressor and reduced by 10dB in the case of an expander. The illustrated characteristic between $f_1$ and $f_3$ applies only to low level signals, however. FIG. 1(a) also shows what happens to the characteristic when a high level component appears at a frequency $f_2$ lying between $f_2$ and $f_3$. The restricted band slides upwardly as shown by dashed lines 10b and 11b, and thus narrows so that the normal gain obtains at $f_1$ while the modified gain applies between $f_2$ and $f_3$. The strong signal component at $f_2$ has eliminated compression and expansion between $f_1$ and $f_2$ but not between $f_2$ and $f_3$.

Figure 1B:
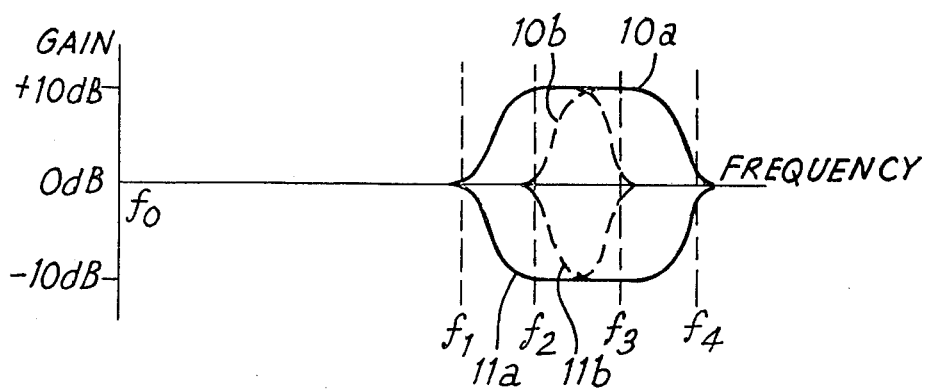

FIG. 1(b) shows the case in which a band of frequencies is treated, as with a multi-band audio compressor or expander. The processed frequencies include those from $f_1$ to $f_4$ as shown by the full lines 10a and 11a. If a high level signal appears at frequency $f_2$, then the bandwidth is restricted to exclude $f_2$, as shown in the dashed lines 10b and 11b. Even in the presence of the high level signal at $f_2$, the frequencies between $f_2$ and $f_3$ are nevertheless compressed or expanded.

Figure 1C:
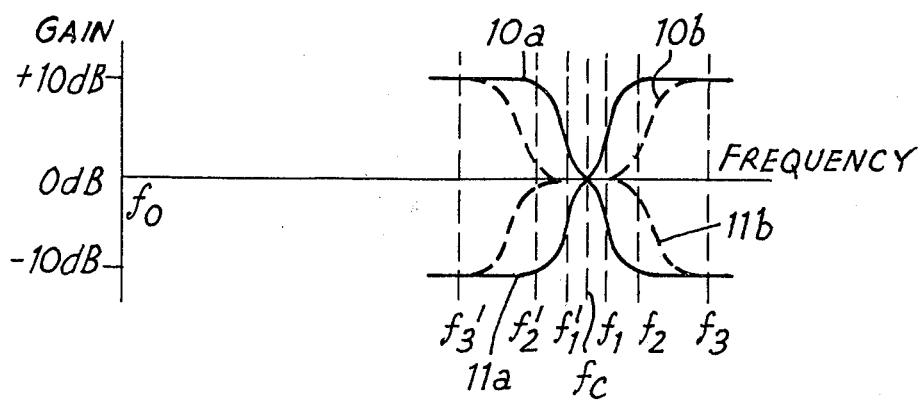

FIG. 1(c) depicts the carrier frequency and sideband situation. In suppressed carrier systems the carrier is absent; if the carrier is not suppressed then it is necessary for the compressor or expander to suppress the carrier during processing of the signal. The frequency responses shown in the figure relate to a compressor and expander in which the carrier at $f_c$ is suppressed and in which the low level sidebands are compressed or expanded.

In the absence of high level signals, the sideband treatment extends from the frequency $f_1$ to $f_3$ and from $f_1'$ to $f_3'$ as shown by the full lines 10a and 11a; these sideband signals correspond to the baseband signals from $f_1$ to $f_3$ shown in FIG. 1(a). If a strong set of sidebands $f_2$ and $f_2'$ should appear, then the suppression bandwidth increases, which is equivalent to a narrowing of the bandwidth(s) in which compression or expansion takes place. The altered frequency responses exclude any processing of the high level sidebands, as shown by the dashed lines 10b and 11b.

Figure 2A:
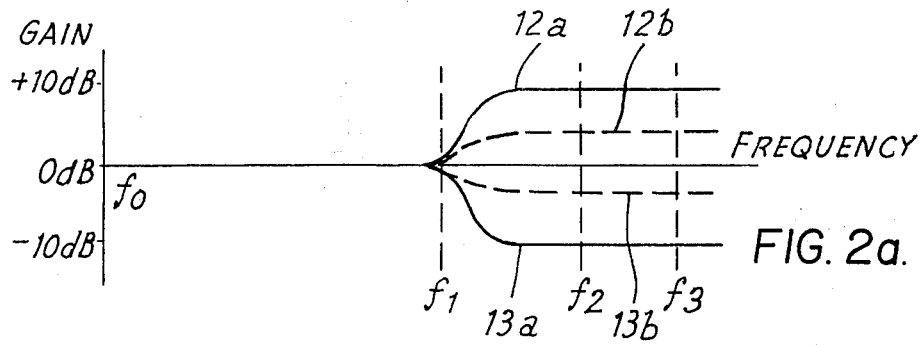
Figure 2B:
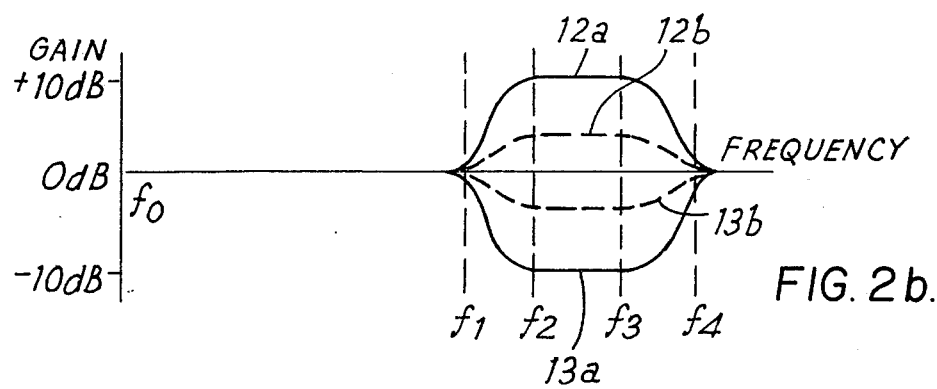
Figure 2C:
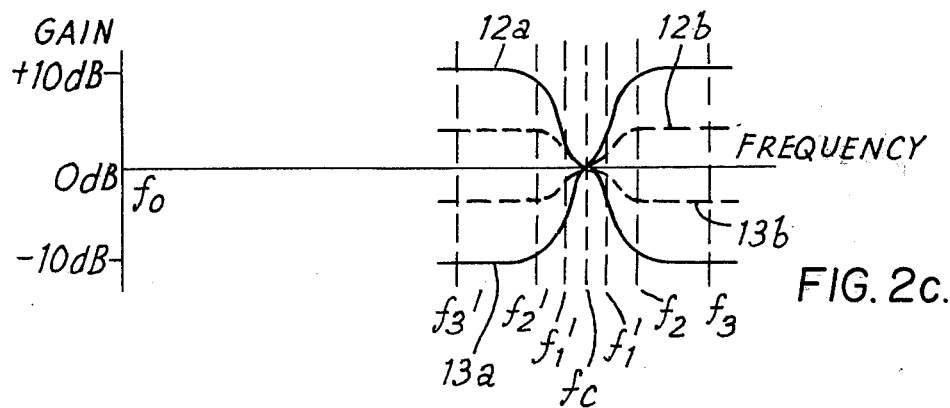

The foregoing may be contrasted with the situation with known frequency selective compressors and expanders which employ serially connected impedance networks; the characteristics of such devices are illustrated in FIGS. 2(a), 2(b) and 2(c). FIG. 2(a) shows the compressor and expander characteristics 12a and 13a which apply when only low level signal components exist between $f_1$ and $f_3$. FIG. 2(a) also shows what happens when a high level component appears at $f_2$. The characteristics 12b and 13b flatten, substantially to eliminate all compression and expansion. It is clear that there is no possibility of retaining useful compression and expansion aove $f_2$. Signal modulated noise effects are therefore likely unless many frequency bands are used.

FIG. 2(b) shows the case in which a band of frequencies is treated, this case being comparable with that of FIG. 1(b). The low level processed frequencies include those from $f_1$ to $f_4$, as shown by the dashed lines 10a and 11a. If a high level signal appears at $f_2$, then the compression or expansion is reduced, as shown by the dashed lines 12b and 13b. Compression or expansion is reduced not only at the frequency $f_2$ but at all frequencies from $f_2$ upwards; clearly this is less desirable from a noise modulation point of view than the narrowing band situation depicted in FIG. 1(b).

The counterpart prior art situation with a carrier frequency and its sidebands is shown in FIG. 2(c). The low level frequency response is given by curves 12a and 13a, which provide for the treatment of frequencies above $f_1$ and below $f_1'$. With the appearance of sidebands at $f_2$ and $f_2'$, the characteristics change to those of 12b and 13b, which show that the degree of compression and expansion has simply been reduced over the whole bandwidth rather than conformed appropriately to the amplitude-frequency distribution of the signal, as in the narrowing band situation shown in FIG. 1(c).

The circuits of FIGS. 3 to 6 are examples of compressors and expanders which are capable of yielding the type of characteristics explained in relation to FIG. 1.

Figure 3:
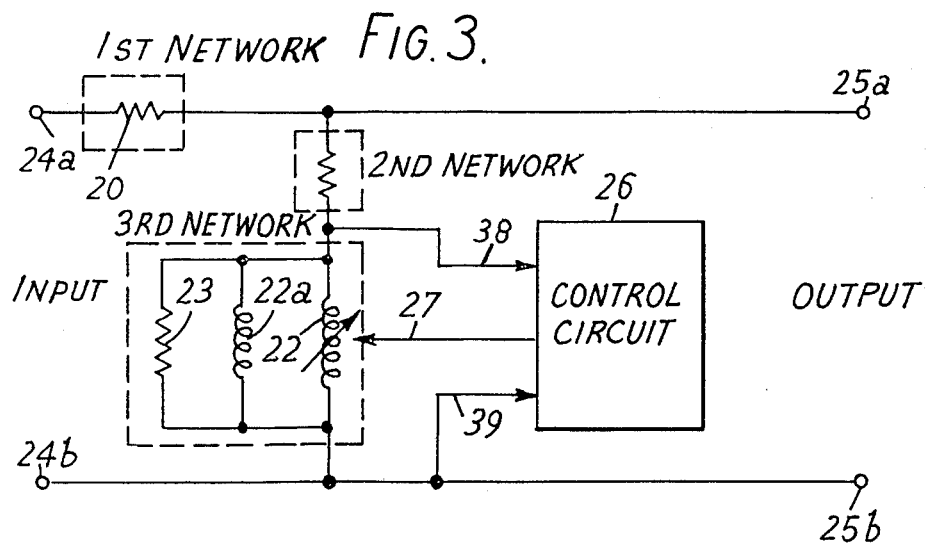
FIG. 3 illustrates one compressor embodying the invention.

In the example of FIG. 3, three series connected impedance networks are employed — first a resistor 20, which may include the source impedance; second a resistor 21; and third a variable inductor 22 in parallel with a resistor 23. The first, second and third networks are connected in series with each other between the input terminals 24a and 24b. The output at terminals 25a and 25b is taken across the combination of the second and third networks.

The potential developed across the third network is sensed by a control circuit 26 which rectifies and smoothes this potential, after amplification if need be, to develop a control signal on a line 27. It is arranged that, as this control signal increases, the value of the inductor 22 is reduced.

The action of the circuit is as follows: When the inductor 22 is at its maximum value it establishes, in conjunction with the resistor 23, a turnover frequency $f_1$ (FIG. 1) which is the lower limit of the restricted frequency band. Below this frequency only the normal characteristic applies. Above this frequency and at low signal levels, the inductor 22 boosts the output voltage at the terminal 25, the output voltage being $$i \left( R_{21} + \frac{jwL_{22}R_{23}}{jwL_{22} + R_{23}} \right)$$

where $i$ is the current in the circuit at angular frequency $w$ and $L_{22}$, $R_{21}$ and $R_{23}$ are the values of the inductor 22 and resistors 21 and 23.

When a substantial signal component within the restricted band appears, the value of L falls, which raises the turnover frequency — e.g. from $f_1$ to $f_2$ (FIG. 1), so that the normal characteristic obtains right up to $f_2$ and the boosted characteristic only obtains above $f_2$. Under very high level, high frequency signal conditions, the inductance is reduced to such an extent that the output signal is determined substantially only by the voltage drop across $R_{21}$.

Figure 4:
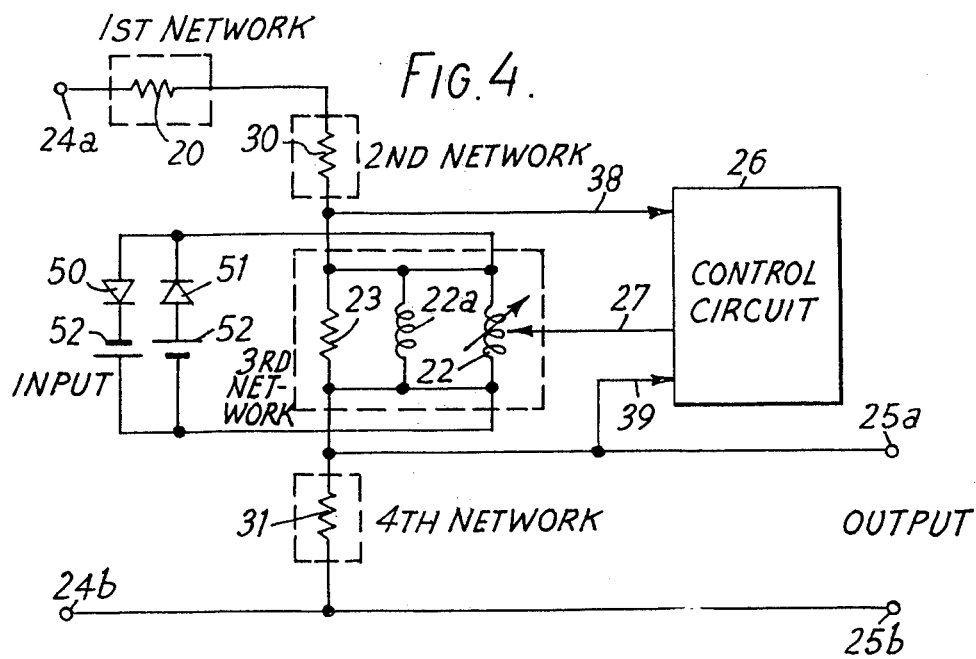
FIG. 4 illustrates one expander embodying the invention.

FIG. 4 shows an example of an expander which utilizes four impedance networks in series between the input terminals 24a and 24b — first a resistor 20, which may include the source impedance; second the resistor 30; third the parallel combination of inductor 22 and resistor 23; and fourth a resistor 31. The output is taken across the resistor 31 which is of very small value, to pick off an output voltage proportional to the current through the first two networks without substantially influencing this current. In a practical circuit, current to voltage conversion methods would be used, such as by feeding the current into the virtual ground input of a negative feedback amplifier or into the emitter of a grounded base transistor, the output voltage being taken from the collector circuit.

In the circuit of FIG. 4, when $L_{22}$ is large, the current through the networks, and hence the output voltage, are reduced at input signal frequencies above the turnover frequency (i.e. the dynamic range is expanded). When a high level input signal component is present, $L_{22}$ falls in value to allow the current to increase up to such a frequency that the high level component is not subjected to the reduction in level. Above this frequency the reduction in level continues to apply. At very high levels at high frequencies the output voltage is determined by the nonvariable impedance networks, the inductive reactance in the variable impedance network being so low at all frequencies that it does not produce any significant expansion of the output signal.

FIG. 5 shows an alternative compressor circuit example in which first, second and third networks are connected between the input terminals 24a and 24b, the output terminals 25a and 25b being connected across the third network. The first network consists of the resistor 20, which may include the source impedance. The second network consists of the parallel combination of resistor 33 and the series combination variable capacitor 32 and resistor 35. The third network consists of a very small resistor 34 which develops an output signal proportional to the current through the first network. As mentioned previously, more sophisticated current-voltage converters may be used. The resistor 35 develops a potential proportional to the capacitor current; this potential is rectified and smoothed by the circuit 26 to develop the control signal on line 27 for controlling the capacitor 32.

At very low levels and at high frequencies, $1/wC_{32}$ is a small impedance and the capacitor $C_{32}$ contributes significantly to the current flowing through the resistor 34, and hence to the output signal. When a high level, high frequency component appears and causes $C_{32}$ to decrease, $1/wC_{32}$ increases and the capacitor current falls. At very high levels the current through resistor 34 is almost exclusively the current through the resistor 33, which establishes the normal, non-boosted characteristic.

In the expander shown in the example of FIG. 6 a resistor 35 constitutes the first network, which may include the source impedance. The output signal is the voltage across the second network, which comprises capacitor 32, resistor 33 and resistor 35. The control circuit responds to the voltage across the capacitor 32.

At low levels and high frequencies the capacitor has a high value and presents a low impedance, whereby the output signal is reduced, above the turnover frequency established by the network components. As the high frequency signal level increases, the value of the capacitor is reduced, thereby to increase its impedance and eliminate the shunting action of the capacitor up to the frequency of all the high level components present, the turnover frequency being pushed upwardly to narrow the band in which the expanding action takes place.

It was mentioned in the introduction that a desirable quality of compressors and expanders for use in noise reduction systems is that, except in the transition region at intermediate levels, the overall characteristics should be substantially independent of the variable circuit element, which should be in one extreme condition or the opposite extreme condition at the two extremes of the dynamic range. In order to minimize the effects of variations or inaccuracies in the values of variable circuit elements at their impedance extremes, fixed impedances can be put in series or in parallel (or both) with the variable impedance, which results in a swamping of errors at the impedance extremes. Thus the variable impedance need be made with high accuracy only at intermediate impedances.

Referring to FIG. 3, a fixed inductor 22a can be placed in parallel with the variable inductor 22. If the value of the variable inductor at low signal levels is very much larger than that of the fixed inductor, then the fixed inductor, together with the other fixed elements, will accurately control the low level characteristics.

In FIG. 4, a similar improvement can be made by putting a fixed inductor 22a in parallel with variable inductor 22. Similarly, in impedance networks utilizing variable capacitors, such as in FIGS. 5 and 6, a fixed capacitor 32a can be placed in series with the variable capacitor 32. With variable resistances, a fixed resistor can be placed in parallel. It will be noted that only the impedance extreme which governs the low level portion of the dynamic range need be swamped. This is because in all of the circuit examples shown the variable impedance is in a DC negative feedback loop in the high level portion, which stabilizes the high level characteristics. At very low levels, below the control threshold, no such stabilization exists, and the swamping technique becomes necessary for accurate results.

Various voltage controlled capacitances and inductances are available for use in the circuits described above, including electro-mechanically variable devices and more complex circuits which present a capacitance or inductance between two terminals of value determined by a voltage controlled resistor within the circuit.

The Control Circuit

FIG. 7 illustrates one form which the control circuit 19 can take. The two input lines 38 and 39 are the lines as so referenced in FIGS. 3 to 6. The voltage across these lines is sensed by a differential amplifier 40, rectified by a rectifier schematically illustrated at block 41, and smoothed by a smoothing circuit 42, to provide the signal on line 27.

The form of smoothing circuit 42 illustrated is suitable for audio applications in which the compressor or expander must act syllabically, i.e. so as to compress the dynamic range without introducing non-linear distortion into the signal. The smoothing circuit comprises a first RC smoothing network formed by a resistor 43 and a capacitor 44 with a relatively short time constant which by itself is insufficient to achieve the required degree of syllabic action. The first network is followed by a second network comprising a series resistor 45 and a shunt capacitor 46 having a longer time constant, which provides effective control signal smoothing. The resistor 45 is shunted by a diode 47 with an appreciable forward voltage drop. The diode can be a silicon diode, for example, such that no diode current flows unless the voltage drop across the resistor 45 exceeds about 0.6 volts.

Thus, for small fluctuations in the control voltage from the first network, the second network is able to function fully. However, for large increases in signal amplitude, the diode 47 conducts and reduces the time constant of the second network markedly. The attack time of the control circuit 19 is thus made short while at the same time keeping signal distortion and the generation of modulation products to a minimum under more uniform signal conditions.

CIRCUITS WITH NON-LINEAR ACTION

FIG. 4 shows an additional practical feature which is also applicable to compressors or expanders in which the voltage across the variable impedance is limited to a small value at high input levels, such as in the circuits of FIG. 3 and FIG. 6. Limiting diodes 50 and 51 in series with suitable bias sources 52 (shown schematically as batteries) are connected across the variable impedance 22. The diodes have the function of preventing the voltage from exceeding a certain small value, as established by the bias, even under extreme transient conditions. Without the diodes the time lag in the control circuit 26 may result in significant modification of high level transient signals. The diodes 51 may also be coupled suitably and biased properly by means of a transformer with a suitable winding ratio, the primary being connected between the two signal points 24 and 25 and the diodes being connected across the secondary. A similar result can be obtained by the use of a differential amplifier with inputs connected across the variable impedance, the output of the amplifier being connected through diodes to the variable impedance to limit the voltage thereacross.

For compressors or expanders in which the current, not the voltage, is limited to a small value, such as in FIG. 5, an analogous arrangement using constant current diodes can be used.

What is claimed is:

1. A circuit for modifying the dynamic range of an input signal, comprising input terminals and two terminal impedance means connected in series between the input terminals to provide an output signal derived from at least part of the impedance means, the impedance means including a frequency selective means determining a frequency band in which no modification of dynamic range takes place, and a restricted frequency band within which the modification of dynamic range takes place and including variable circuit means responsive to the level of signal components in the restricted band to reduce the degree of dynamic range modification as the level of such components increases, the variable circuit means being constructed and arranged to narrow the restricted band as the level of signal components within the restricted band increases above a level predetermined at −20dB or less, thereby to broaden the band in which no modification of dynamic range takes place and to exclude such signal components from dynamic range modification.

2. A circuit according to claim 1, wherein the variable circuit means presents a reactive impedance.

3. A circuit according to claim 1, comprising a syllabic control circuit responsive to the voltage across or current through a variable circuit element of the variable circuit means to vary the impedance thereof.

4. A circuit according to claim 1, comprising a current source drive circuit connected to the input terminals and wherein output terminals are connected to provide as the output signal the voltage developed across at least the frequency selective impedance means.

5. A circuit according to claim 1, comprising a voltage source drive circuit connected to the input terminals and wherein the impedance means includes a current sensing impedance means which produces the output signal.

6. A circuit according to claim 1, wherein the level of the output signal is boosted within the restricted band, whereby the circuit functions as a compressor.

7. A circuit according to claim 1, wherein the level of the output signal is reduced within the restricted band, whereby the circuit functions as an expander.

8. A circuit according to claim 1, wherein the said restricted band is a high frequency band and the said narrowing thereof comprises shifting upwardly the lower cut-off frequency thereof.

9. A circuit according to claim 1, wherein the dynamic range modification is restricted to low level components in said restricted frequency band.

10. A circuit according to claim 9, wherein the dynamic range modification is restricted to components in said restricted frequency band which are one order of magnitude less, or even smaller, than nominal maximum operating level.

11. A circuit according to claim 1, wherein the two-terminal impedance means comprises a plurality of constituent two-terminal impedance means connected in series with each other.

12. A circuit according to claim 11, wherein one of the impedance means is a resistive network providing a linear component of the output signal.

13. A circuit according to claim 12, wherein the frequency selective impedance means has the characteristics of a resistance in parallel with a variable inductance.

14. A circuit for modifying the dynamic range of an input signal, comprising a current drive circuit responsive to the input signal, a plurality of two terminal impedance means connected in series with each other and to the current drive circuit to pass a current determined by the current drive circuit in accordance with the input signal, the impedance means comprising at least a first, resistive network and a second, frequency selective means having the characteristics of a resistance in parallel with a variable inductance, output terminals connected across at least the first impedance means to provide an output voltage signal having a linear component developed across the first means and a non-linear component created by the second means and effective to establish dynamic range modification within a restricted frequency band, the second, frequency selective means including circuit means responsive to the level of signal components in the restricted band to vary the inductance characteristic of the second means to reduce the degree of dynamic range modification as the level of such signal components increases by the action of narrowing the said restricted band so as to exclude therefrom signal components above a level predetermined at − 20dB or less.

15. A circuit for modifying the dynamic range of an input signal, comprising a plurality of impedance networks which include a frequency selective network and which are connected in series with each other, input and output connections to the circuit for deriving an output signal from an input signal with a dynamic-range modifying boost or cut in level of said output signal in a restricted frequency band established by the frequency selective network, the frequency selective network being operable to narrow said restricted band and to broaden a complementary band in which there is no boost or cut as the level of signal components in said restricted band increases above a level predetermined at −20dB or less, thereby to exclude from said restricted band, as narrowed, components above said predetermined level, which components fall within said complementary band, as broadened, and are not subjected to modification of dynamic range.

16. A circuit for modifying the dynamic range of an input signal, comprising an input circuit, a plurality of impedance newtworks series connected with said input circuit, an output circuit connected in circuit with at least one of said networks to derive an output signal from said input signal, one of the networks having variable impedance including reactance characteristics, and control means connected to respond to the level of a selected signal in said dynamic range modifying circuit and further connected to control said variable impedance characteristics in dependence upon said level, thereby to narrow, as said level rises, a band selected by said one network and within which said dynamic range modifying takes place, so as to exclude from said band signal components above a level predetermined at −20dB or less and provide varying dynamic range modifications as said level varies.

17. A circuit according to claim 16, wherein said one network includes a capacitive component.

18. A noise reduction system comprising a first circuit for compressing the dynamic range of an input signal and a second circuit for expanding the dynamic range of the compressed signal after transmission and/or recording/playback thereof, the first circuit comprising a plurality of two-terminal impedance networks connected to input terminals to establish a signal determined by the input signal, thereby to produce an output compressed signal derived from one or more of the networks, at least one of the networks being a frequency selective network determining a restricted frequency band within which compression of dynamic range takes place and including variable circuit means responsive to the level of signal components in the restricted band to reduce the degree of compression as the level of such components increases, the variable circuit means being constructed and arranged to narrow the restricted band as the level of signal components within the restricted band increases above a level predetermined at −20dB or less, thereby to exclude such components from dynamic range compression, the second circuit comprising a plurality of two-terminal impedance networks connected to input terminals to establish a signal determined by the compressed signal, thereby to produce an output expanded signal derived from one or more of the networks, at least one of the networks being a frequency selective network determining a restricted frequency band within which expansion of dynamic range takes place and including variable circuit means responsive to the level of signal components in the restricted band to reduce the degree of expansion as the level of such components increases, the variable circuit means being constructed and arranged to narrow the restricted band as the level of signal components within the restricted band increases above a level predetermined at −20dB or less, thereby to exclude such components from dynamic range expansion.

19. A circuit for modifying the dynamic range of an input signal and having switchably selectable compression and expansion modes, the circuit comprising a plurality of series connected, two-terminal impedance networks, connected to derive an output signal from an input signal, at least one of the networks being a frequency selective network determining a restricted frequency band within which the modification of dynamic range takes place and including variable circuit means responsive to the level of signal components in the restricted band to reduce the degree of dynamic range modification as the level of such components increases, the variable circuit means being constructed and arranged to narrow the restricted band as the level of signal components within the restricted band increases above a level predetermined at −20dB or less, thereby to exclude such components from dynamic range modification, the circuit acting to boost the level of the output signal within the restricted band in the compression mode and to reduce the level of the output signal within the restricted band in the expansion mode.

20. A method of modifying the dynamic range of an input signal, wherein the input signal is applied to a plurality of series connected, two-terminal impedance networks and an output signal is derived from one or more of the networks so as to comprise a component linearly related to the input signal and a component non-linearly related to the input signal and which effects the modifiction of dynamic range, determining the characteristics of the non-linear component and restricting this component to a restricted frequency band by a frequency selective network included in said plurality of networks, and causing said band to narrow to exclude from the dynamic range modification high level signal components which exceed a level predetermined at −20dB or less.

21. A method according to claim 20, wherein the non-linear component is caused to boost the linear component so as to compress the dynamic range.

22. A method according to claim 20, wherein the non-linear component is caused to reduce the linear component so as to expand the dynamic range.

23. A method according to claim 20, wherein the input signal is applied as a current drive to the series connected networks and the output signal is derived as the voltage across at least the frequency selective network.

24. A method according to claim 20, wherein the input signal is applied as a voltage across the series connected networks and the output signal is derived in accordance with the current through one of the networks.

25. A circuit for modifying the dynamic range of an input signal, comprising an input circuit, a voltage divider comprising a plurality of series connected impedance networks connected to said input circuit to be energized with an input voltage in accordance with said input signal, and an output circuit connected across at least one of said networks to derive an output signal which is a proportion determined by the voltage divider of said input voltage, the parameters of said impedance networks of said voltage divider establishing a frequency dependent characteristic whereby said output signal bears a first relationship to said input voltage below a turnover frequency, and a second relationship, different from said first relationship, above said turnover frequency, said one network including at least one capacitor, and said dynamic range modifying circuit further including control means connected to respond to the level of a selected signal in said dynamic range modifying circuit and further connected to vary the impedance of said one network in dependence upon said level so as to shift said turnover frequency upwardly as said level rises, so that said turnover frequency is maintained above the frequency of signal components whose amplitude exceed a level predetermined at −20dB or less.

26. A circuit according to claim 25, wherein said selected signal is a signal in said one network.

* * * * *